(12) United States Patent
Iizuka

(10) Patent No.: US 7,716,549 B2
(45) Date of Patent: May 11, 2010

(54) SEMICONDUCTOR APPARATUS AND TESTING METHOD

(75) Inventor: Yoshikazu Iizuka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 449 days.

(21) Appl. No.: 11/896,208

(22) Filed: Aug. 30, 2007

(65) Prior Publication Data
US 2008/0059851 A1    Mar. 6, 2008

(30) Foreign Application Priority Data
Aug. 31, 2006   (JP)   .......................... P.2006-236116

(51) Int. Cl.
*G01R 31/28* (2006.01)
(52) U.S. Cl. ...................... 714/733; 714/718
(58) Field of Classification Search ................ 365/200, 365/201, 63; 710/72; 714/731, 724, 733, 714/718
See application file for complete search history.

(56) References Cited

U.S. PATENT DOCUMENTS

| | | | |
|---|---|---|---|
| 4,980,889 A | * | 12/1990 | DeGuise et al. ............. 714/731 |
| 6,115,763 A | * | 9/2000 | Douskey et al. ............... 710/72 |
| 7,352,638 B2 | * | 4/2008 | Suitou et al. ................. 365/200 |
| 2001/0003051 A1 | * | 6/2001 | Yoshizawa ................... 438/257 |
| 2005/0149792 A1 | * | 7/2005 | Furuyama .................... 714/724 |
| 2005/0289423 A1 | | 12/2005 | Yabuta |
| 2008/0037309 A1 | * | 2/2008 | Makino ........................ 365/63 |
| 2009/0040852 A1 | * | 2/2009 | Tomita ........................ 365/201 |

FOREIGN PATENT DOCUMENTS

| | | |
|---|---|---|
| JP | 2002-298598 | 10/2002 |
| JP | 2004-86996 | 3/2004 |

* cited by examiner

*Primary Examiner*—David Ton
(74) *Attorney, Agent, or Firm*—Finnegan, Henderson, Farabow, Garrett & Dunner, L.L.P.

(57) ABSTRACT

A semiconductor apparatus comprising: a plurality of memory circuits each including a memory and an input/output selector, the memory having a plurality of memory cells and a plurality of input/output circuits respectively corresponding to the memory cells; and an incorporated self-test circuit that executes a quality test for the memory, wherein the input/output selector selects one of the input/output circuits and successively outputs data signals to the incorporated self-test circuit, the data signals read by the one of the input/output circuits from the corresponding memory cells.

14 Claims, 9 Drawing Sheets

SEMICONDUCTOR APPARATUS AND TESTING METHOD

CROSS-REFERENCE TO RELATED APPLICATIONS

This application is based upon and claims the benefit of priority from Japanese Patent Application No. 2006-236116, filed Aug. 31, 2006, the entire contents of which are incorporated herein by reference.

BACKGROUND OF THE INVENTION

One embodiment of the invention relates to a semiconductor apparatus comprising a memory, and more particularly to a semiconductor apparatus having an incorporated self-test and a method of testing a failure analysis of the memory through the incorporated self-test.

The number of memories to be loaded onto a system large scale integrated circuit (LSI) reaches several tens to several hundreds, and most of the memories have been tested by an incorporated self-test (BIST: Built in Self Test) Irrespective of the presence of the BIST, there is no change in a flow in which the failure is analyzed to investigate the cause of the failure and a countermeasure is taken when a failure is found in the memory. A fail bit map (FBM) is the most effective for the failure analysis of the memory.

In the case in which access is directly given to the memory by using a normal memory tester to carry out a test, an FBM acquirement is very easy. The same address space as a memory to be measured is mapped into a failure analyzing memory in the tester and a result of the test for each cell is stored in the failure analyzing memory synchronously with the test. A general memory tester has the mapping function standardly.

On the other hand, the FBM acquirement of the memory subjected to the BIST is very complicated. In a test mode using the normal BIST, an output of the memory is compared with an expected value in a BIST circuit and only a result thereof is output to an external pin.

For example, in a basic operation in the test mode through the BIST, an address signal, a memory control signal and write data are input from the BIST circuit to each of a plurality of memory circuits, and writing and reading operations are carried out for the memory of the memory circuit. Data read from the memory are input to a comparator via a data register in the memory circuit and are compared with the expected value output from the BIST circuit. In the BIST circuit, a logical sum of the comparison results of the memories is output as a test result.

For the FBM acquirement, it is necessary to know an address of a memory cell having a failure. Even if a result of quality of the memory can be acquired in an operation in the test mode of the memory BIST, however, it is impossible to acquire an address of a defective cell. In order to obtain the address of the defective cell, a BIST having a failure analyzing mode is present in addition to a normal test mode.

In a general failure analyzing mode, failure analysis data read from the memory are output to the external pin through a shift chain path. For example, failure analysis data corresponding to one address which are read from the cell of the memory are once stored in the data register. The data register of each memory circuit is connected like a shift register through the shift chain path, and the failure analysis data are successively output from the BIST circuit to an external output pin through a shift-out operation. By comparing output data with the expected value over the tester, it is possible to detect the failure. An address of a defective cell is led from a failure detecting step, and an FBM is created to carry out the failure analysis for the memory. A relationship between the failure detecting step and the defective address can be obtained from a size of the memory to be measured and a test specification of the BIST.

In a general failure analyzing mode, a timing chart including a shift-out step after the reading step is used. Therefore, it is possible to output the failure analysis data on the memory to an outside and to acquire the FBM of the memory subjected to the BIST. However, the shift-out operation for the failure analysis data read after the failure analysis data are read from the memory is carried out. Therefore, an operation for carrying out write to the memory cannot be immediately started and it is impossible to give continuous access to the memory. For this reason, the memory is not tested at an actual specification frequency.

The cause of the failure of the memory is not restricted to a physical open/short circuit. For example, a failure caused by a parasitic capacitance or a parasitic resistance can be detected by only a high-speed test in many cases. Accordingly, it is necessary to test the memory at the actual specification frequency.

There has been proposed a failure analyzing mode for testing a memory at an actual specification speed by using a BIST (for example, see Patent Documents JP-A-2002-298598 and JP-A-2004-86996). In the failure analyzing mode which has been proposed, failure analysis data output at a high speed are stored in a memory for an FBM which is provided separately from or provided in a semiconductor apparatus in order to hold a test result. After the end of the test, the failure analysis data which are stored are processed by a low-speed tester to create the FBM. In the Patent Document JP-A-2002-298598, however, the failure analysis data which are read are successively output to the memory for the FBM. For this reason, it is impossible to carry out the write to the memory immediately after the reading operation. In the Patent Document JP-A-2004-86996, when a defective bit is detected, an operation for reading a next address is stopped for a certain clock number period. Even if the memory is tested by using a clock having an actual specification in the failure analyzing mode, accordingly, an actual memory test is partially interrupted. In the failure analyzing mode, therefore, it is hard to output the failure analysis data while testing the memory at the actual specification frequency.

SUMMARY OF THE INVENTION

One of objects of the present invention is to provide a semiconductor apparatus capable of outputting failure analysis test data while testing a memory at an actual specification frequency through a BIST, and a testing method.

According to an aspect of the present invention there is provided a semiconductor apparatus comprising: a plurality of memory circuits each including a memory and an input/output selector, the memory having a plurality of memory cells and a plurality of input/output circuits respectively corresponding to the memory cells; and an incorporated self-test circuit that executes a quality test for the memory, wherein the input/output selector selects one of the input/output circuits and successively outputs data signals to the incorporated self-test circuit, the data signals read by the one of the input/output circuits from the corresponding memory cells.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE EMBODIMENTS

Figure 1:
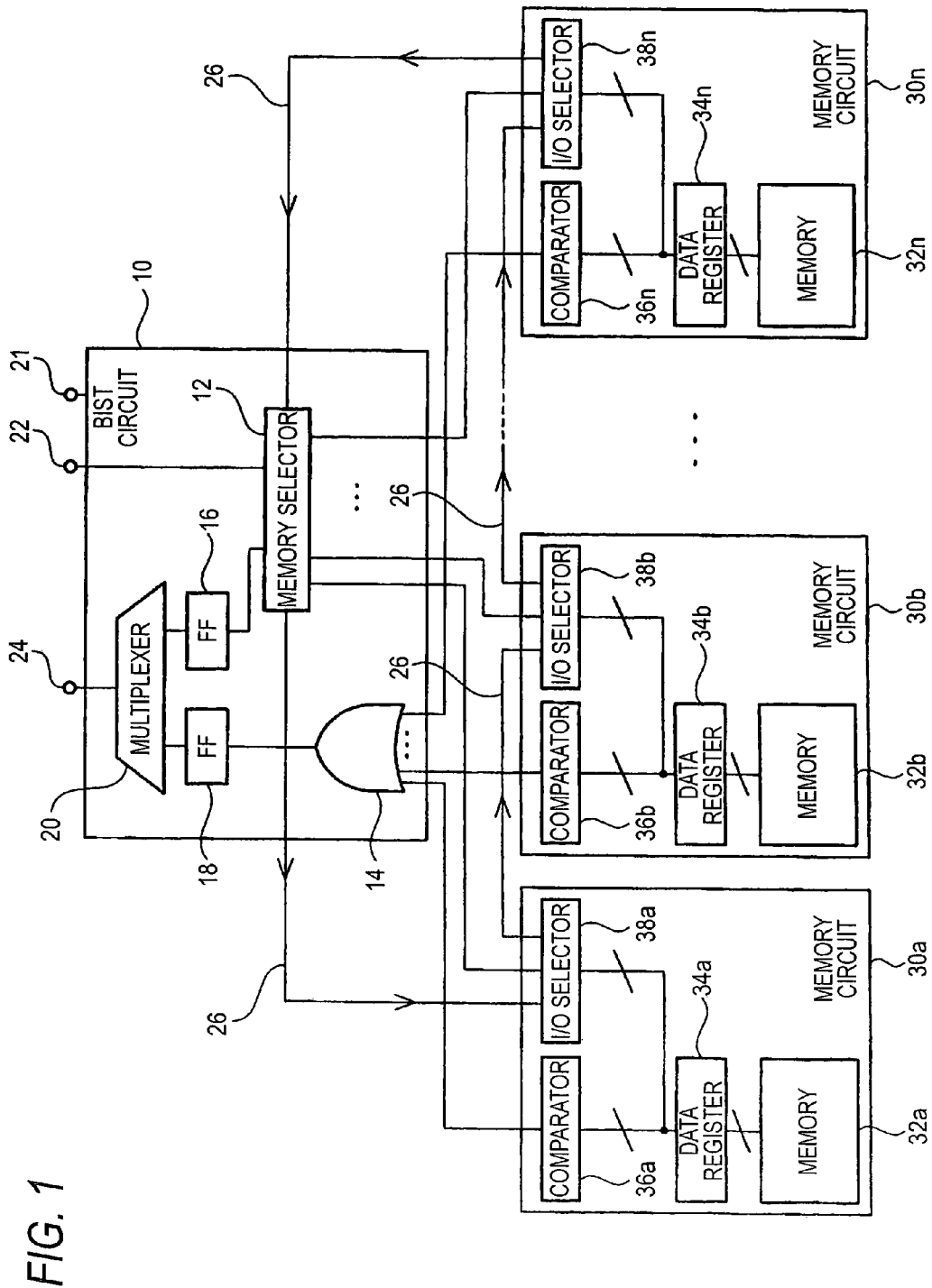
FIG. 1 is an exemplary schematic diagram showing an example of a structure of a semiconductor apparatus according to an embodiment of the invention.

With reference to the drawings, an embodiment according to the invention will be described below. In the description of the following drawings, the same or similar portions have the same or similar reference numerals. Attention is to be paid to the fact that the drawings are typical and structures of an apparatus and a system are different from actual ones. Accordingly, specific structures are to be decided in consideration of the following description. Moreover, it is a matter of course that portions having different structures from each other are included in the mutual drawings.

A semiconductor apparatus according to the embodiment of the invention comprises a BIST circuit 10, and a plurality of memory circuits 30a, 30b, . . . , 30n as shown in FIG. 1. Input pins 21 and 22 and an output pin 24 are provided as external connecting terminals of an external device such as a tester and the BIS circuit 10. The BIST circuit 10 includes a memory selector 12, a logical sum (OR) circuit 14, flip-flops (FFs) 16 and 18, and a multiplexer 20. The memory circuits 30a to 30n include memories 32a, 32b, . . . , 32n, data registers 34a, 34b, . . . , 34n, comparators 36a, 36b, . . . , 36n, and input/output (I/O) selectors 38a, 38b, . . . , 38n, respectively. Each of the memories 32a to 32n includes a memory cell array having a plurality of memory cells, and a plurality of input/output (I/O) circuits capable of giving access to the respective memory cells, which is not shown in FIG. 1. Each of the I/O selectors 38a to 38n is connected to the I/O circuit of each of the memories 32a to 32n, and the I/O circuits are successively selected and data signals read from the respective memory cells are successively output through the target I/O circuit which is selected. The memory selector 12 has an input node connected to each of output nodes of the input/output selectors 38a to 38n, a target memory is selected from the memories 32a to 32n, and a data signal input from the I/O selector of the memory circuit including the target memory is successively output to the output pin 24 through the FF 16 and the multiplexer 20.

The data registers 34a to 34n are connected to rear stages of the memories 32a to 32n of the memory circuits 30a to 30n, respectively. The comparators 36a to 36n and the I/O selectors 38a to 38n are connected in parallel with each other in the respective rear stages of the data registers 34a to 34n. Corresponding to a plurality of I/O circuits of the memories 32a to 32n which are not shown in FIG. 1, the memories 32a to 32n and the data registers 34a to 34n, and the data registers 34a to 34n and the comparators 36a to 36n and I/O selectors 38a to 38n are connected in parallel through a plurality of wirings.

Respective outputs of the comparators 36a to 36n are connected to a plurality of input nodes of the OR circuit 14 in the BIST circuit 10 in parallel. An output node of the OR circuit 14 is connected to an input node of the FF 18. An output node of the FF 18 is connected to one of input nodes of the multiplexer 20.

Respective output nodes of the I/O selectors 38a to 38n are connected to a plurality of input nodes of the memory selector 12 in the BIST circuit 10 in parallel. An output node of the memory selector 12 is connected to an input node of the FF 16. An output node of the FF 16 is connected to the other input node of the multiplexer 20.

The input pin 21 of the semiconductor apparatus is connected to the BIST circuit 10. The input pin 22 is connected to the memory selector 12. The output pin 24 is connected to the output of the multiplexer 20. There is provided a shift chain path 26 for successively carrying out a series connection via the I/O selectors 38a to 38n from the memory selector 12.

In a quality test mode through the BIST, the comparators 36a to 36n, the OR circuit 14 and the FF 18 are used. For example, a control signal, an address signal and a data signal which are generated by a timing generator and a pattern generator (not shown) which are provided in the BIST circuit 10 are input to the respective memory circuits 30a to 30n. Based on the control signal and the address signal, operations for writing and reading the data signal are carried out for the respective memory cells of the memories 32a to 32n.

Figure 2:
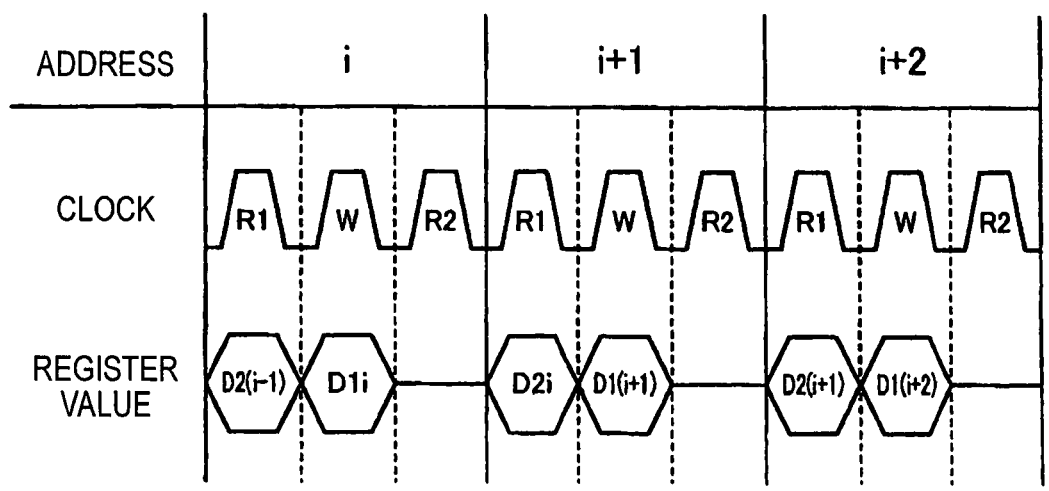
FIG. 2 is an exemplary diagram showing an example of a timing chart for a quality test of the semiconductor apparatus according to the embodiment of the invention.

For example, as shown in FIG. 2, writing and reading operations are carried out for a memory cell in an address i synchronously with a reference clock having an actual specification frequency. First of all, an initial value is read in a step R1. Next, a data signal is written in a step W. Then, the data signal in a step R2 is read. The initial value and the data value which are read in the reading steps R1 and R2 for the address i are stored in each of the data registers 34a to 34n and are thus stored therein. As a result, a delay is carried out by one clock cycle from the times of the steps R1, W and R2 in the address i and register values D1i and D2i are stored in each of the data registers 34a to 34n with an empty value interposed therebetween.

By setting three steps including the steps R1, W and R2 as one test cycle, the test cycle is repeated by the number of addresses assigned to each of the memories 32a to 32n. For example, during the writing and reading operations for memory cells in addresses i to (i+2), data signals read from the respective memory cells are stored in the data registers 34a to 34n synchronously with the steps R1 and R2 so as to be delayed by one clock cycle as register values D2 (i−1), D1i, D2i, D1(i+1), D2(i+1) and D1(i+2).

Thus, the data read from the respective memory cells stored in the data registers 34a to 34n are input to the comparators 36a to 36n, respectively. In each of the comparators 36a to 36n, a pattern of the input data is compared with an expected value output from the pattern generator of the BIST circuit. A result of the comparison is input to the OR circuit 14. A logical sum of the results of the comparison which are sent from the comparators 36a to 36n is calculated in the OR circuit 14, and quality (pass/fail) deciding signals of the memories 32a to 32n are output to the output pin 24 via the FF 18.

As described above, in the quality test mode, it is possible to decide the quality of the memories 32a to 32n at the actual specification frequency. However, it is impossible to specify an address of the defective memory cell. Therefore, it is hard to acquire an effective FBM for the failure analysis of the memories 32a to 32n.

Figure 3:
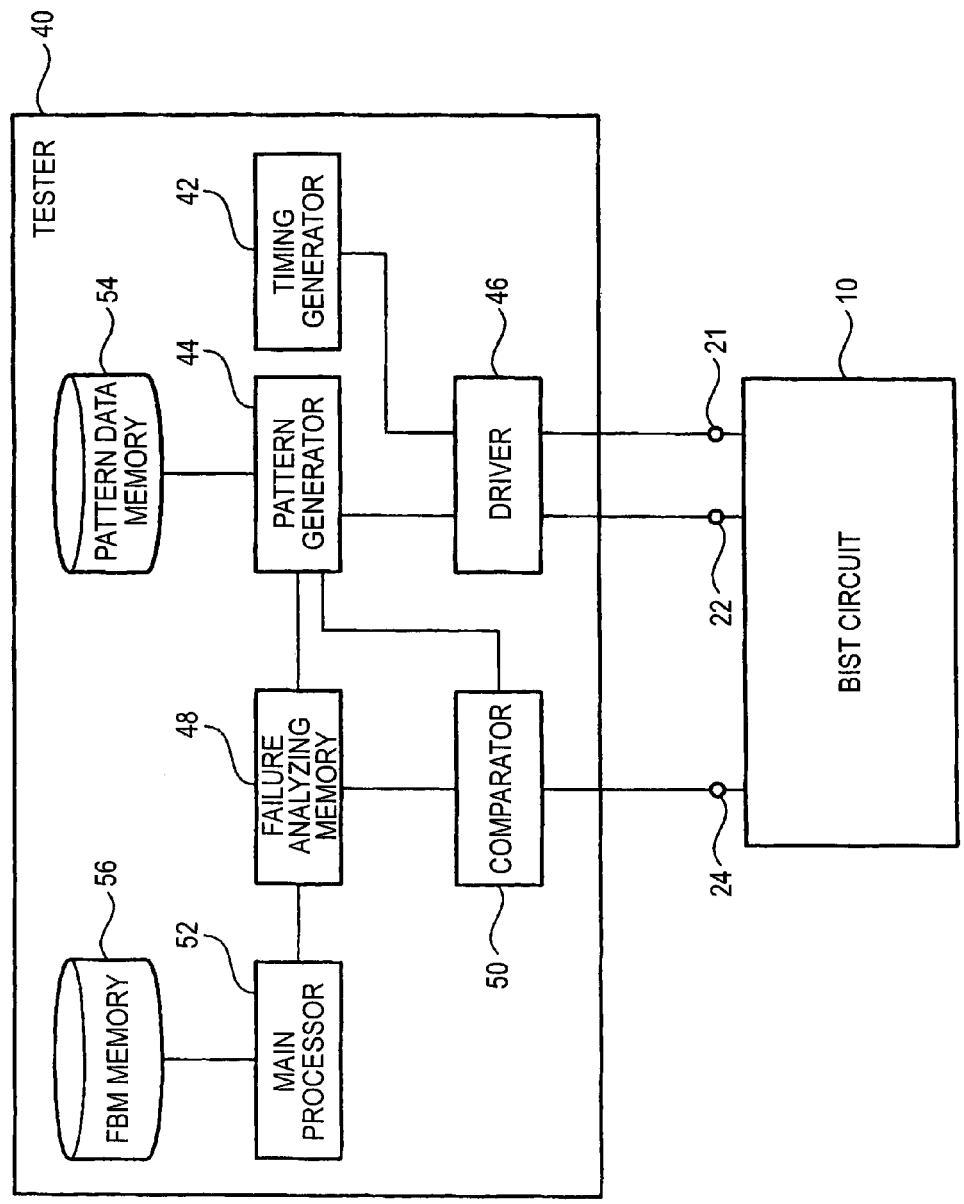
FIG. 3 is an exemplary schematic diagram showing an example of a structure of a tester for executing a failure analysis for the semiconductor apparatus according to the embodiment of the invention.

On the other hand, in the failure analyzing mode for acquiring the FBM, the I/O selectors 38a to 38n, the memory selector 12 and the FF 16 are used. As shown in FIG. 3, moreover, a tester 40 is connected to the semiconductor apparatus through the input pins 21 and 22 and the output pin 24 when the failure analysis for the memories 32a to 32n is to be executed.

The tester 40 includes a timing generator 42, a pattern generator 44, a driver 46, a failure analyzing memory 48, a comparator 50, a main processor 52, a pattern data memory 54, and an FBM memory 56. The timing generator 42 and the pattern generator 44 are connected to the input pins 21 and 22 through the driver 46, respectively. The pattern generator 44 connected to the pattern data memory 54 is connected to the failure analyzing memory 48 and the comparator 50. The comparator 50 connected to the failure analyzing memory 48 is connected to the output pin 24. The main processor 52 connected to the FBM memory 56 is connected to the failure analyzing memory 48.

The pattern generator 44 of the tester 40 uses pattern data information about a control signal, an address signal, a data signal and an input selecting signal which are stored in the pattern data memory 54 to generate pattern data on test signals and pattern data on the selecting signal. The timing generator 42 generates a timing for synchronizing the test signal with the selecting signal. The respective pattern data on the test signal and the selecting signal are output to the input pins 21 and 22 through the driver 46.

The comparator 50 compares the test data output from the BIST circuit 10 through the output pin 24 with an expected value acquired from the pattern generator 44. A result of the comparison is stored in the failure analyzing memory 48.

The main processor 52 creates an FBM of a memory to be a failure analyzing target and stores the FBM in the FBM memory 56 based on the result of the comparison which are stored in the failure analyzing memory 48 and the pattern data which are stored in the pattern data memory 54.

Figure 4:
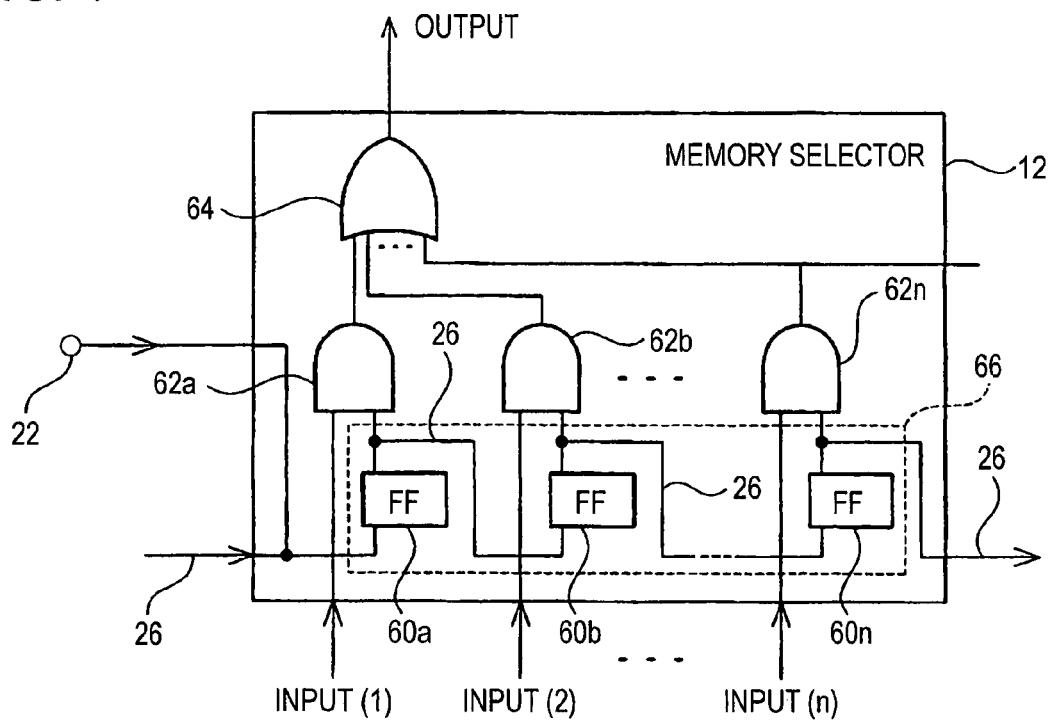
FIG. 4 is an exemplary schematic diagram showing an example of a structure of a memory selector according to the embodiment of the invention.

As shown in FIG. 4, the memory selector 12 is a decoder including a plurality of input nodes (1), (2), ..., (n), a memory setting circuit 66, a plurality of logical product (AND) circuits 62a, 62b, ..., 62n, and an OR circuit 64. The memory setting circuit 66 has a plurality of FFs 60a, 60b, 60n. Although a digital type decoder is used in the embodiment, an analog type decoder may be used. Output nodes of the I/O selectors 38a to 38n are connected to the input nodes (1) to (n), respectively. The respective FFs 60a to 60n are connected in series to each other like a shift register through the shift chain path 26 connected to the input pin 22. The input nodes (1) to (n) and output nodes of the FFs 60a to 60n are connected to input nodes of the AND circuits 62a to 62n, respectively. Respective output nodes of the AND circuits 62a to 62n are connected in parallel with a plurality of input nodes of the OR circuit 64, respectively.

Figure 5:
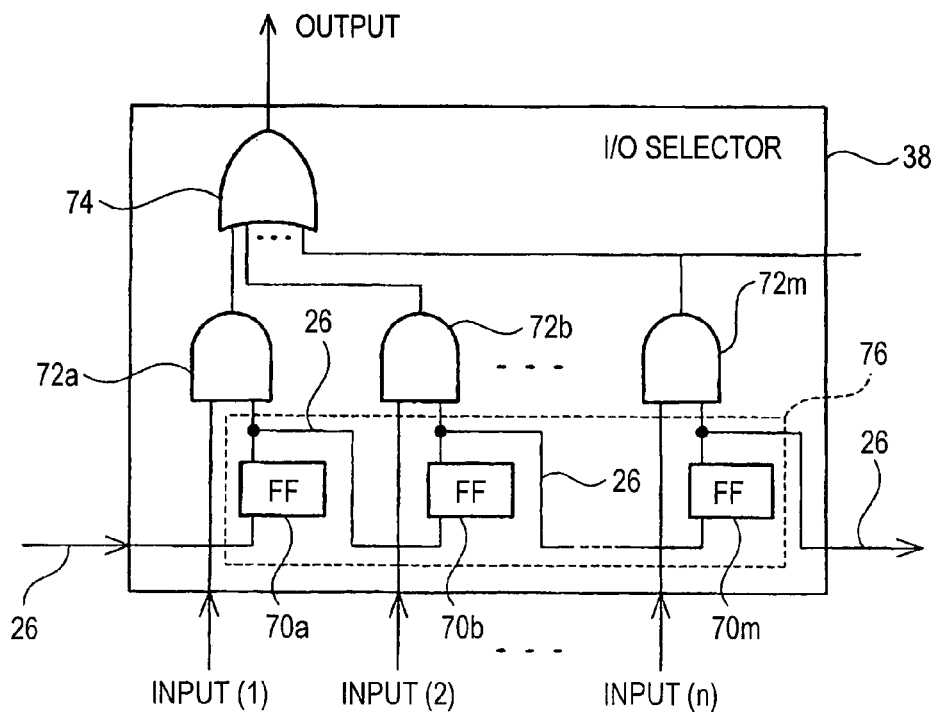
FIG. 5 is an exemplary schematic diagram showing an example of a structure of an I/O selector according to the embodiment of the invention.

FIG. 5 is a diagram in which one of the I/O selectors 38a to 38n illustrated in FIG. 1 is selected to be typical and is shown as an I/O selector 38. As shown in FIG. 5, the I/O selector 38 is a decoder including a plurality of input nodes (1), (2), ..., (m), an I/O setting circuit 76, a plurality of AND circuits 72a, 72b, ..., 72m, and an OR circuit 74. The I/O setting circuit 76 has a plurality of FFs 70a, 70b, ..., 70m. Although a digital type decoder is used in the embodiment, an analog type decoder may be used output nodes of the data registers 34a to 34n are connected to the input nodes (1) to (n), respectively. The respective FFs 70a to 70m are connected in series to each other like a shift register through the shift chain path 26 connected to the input pin 22. The input nodes (1) to (m) and output nodes of the FFs 70a to 70m are connected to input nodes of the AND circuits 72a to 72m, respectively. Respective output nodes of the AND circuits 72a to 72m are connected in parallel with a plurality of input nodes of the OR circuit 74, respectively.

Figure 6:
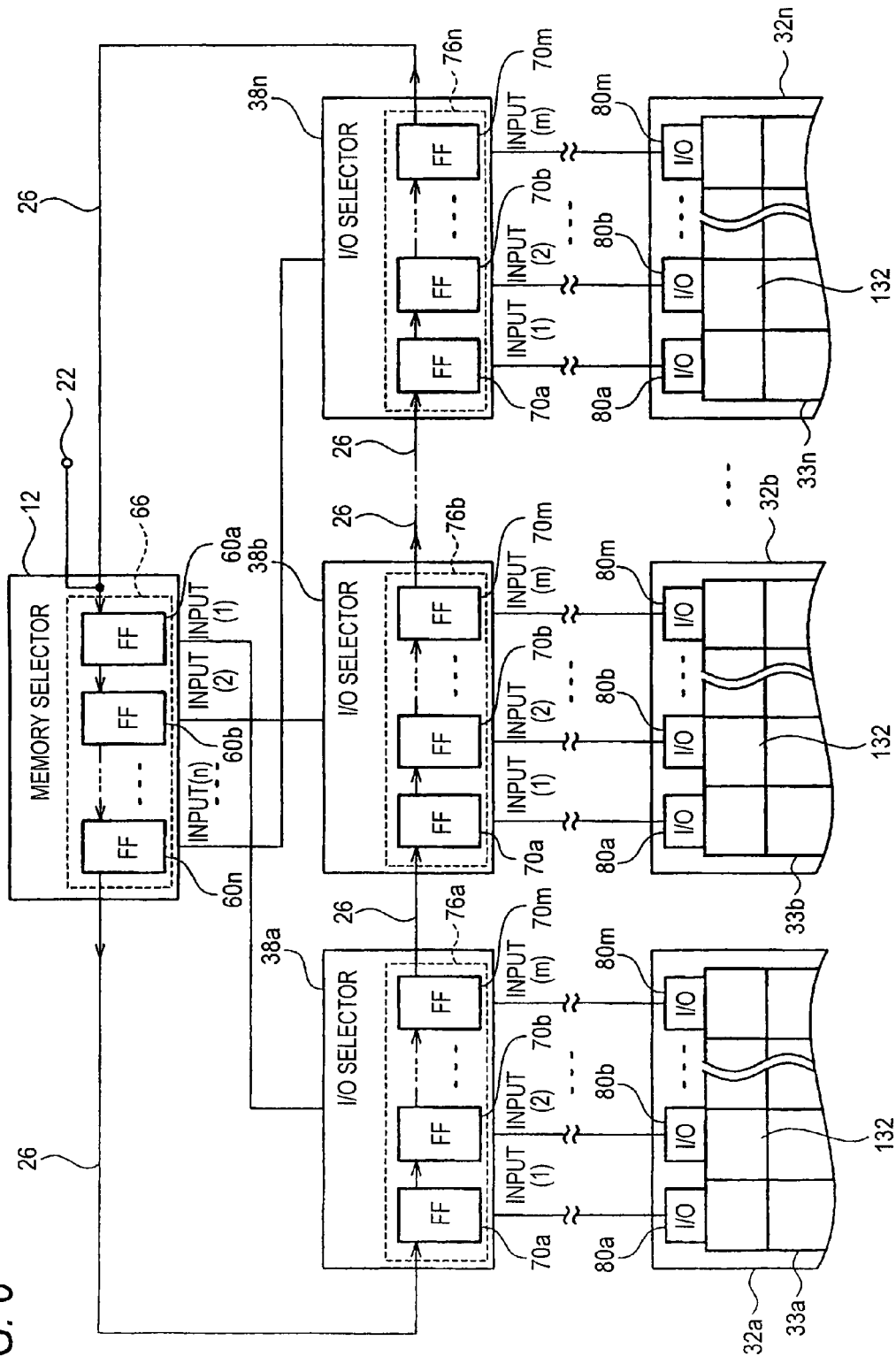
FIG. 6 is an exemplary diagram for explaining the selection of a memory and an I/O circuit in the failure analysis for the semiconductor apparatus according to the embodiment of the invention.

As shown in FIG. 6, the memories 32a to 32n are provided with a plurality of I/O circuits 80a, 80b, ..., 80m capable of giving access to a plurality of memory cells 132 of memory cell arrays 33a, 33b, ..., 33n respectively. Output nodes of the data registers 34a to 34n corresponding to the I/O circuits 80a to 80m of each of the memories 32a to 32n are connected to the input nodes (1) to (m) of each of the I/O selectors 38a to 38n, respectively. The FFs 70a to 70m are connected in series like a shift register through the shift chain path 26, respectively.

The memory setting circuit 66 of the memory selector 12 and I/O setting circuits 76a, 76b, ..., 76n of the I/O selectors 38a to 38n are connected in series like a shift register through the shift chain path 26 as shown in FIG. 6. Based on pattern data on selecting signals to be input from the input pin 22 to the memory setting circuit 66 and each of the I/O setting circuits 76a to 76n, a target memory and a target I/O circuit are selected from the memories 32a to 32n and the I/O circuits 80a to 80m of each of the memories 32a to 32n. For example, in the case in which the memory 32a and the I/O circuit 80a are selected as the target memory and the target I/O circuit, the states of the FF 60a of the memory selector 12 and the FF 70a of the I/O selector 38a are set to be "1" and the states of the FFs of the memories 32b to 32m and the I/O circuits 80b to 80m which are not selected are set to be "0". Accordingly, the pattern data on the selecting signal in this case are "10 ... 010 ... 010 ... 0 ... 10 ... 0".

Figure 7:
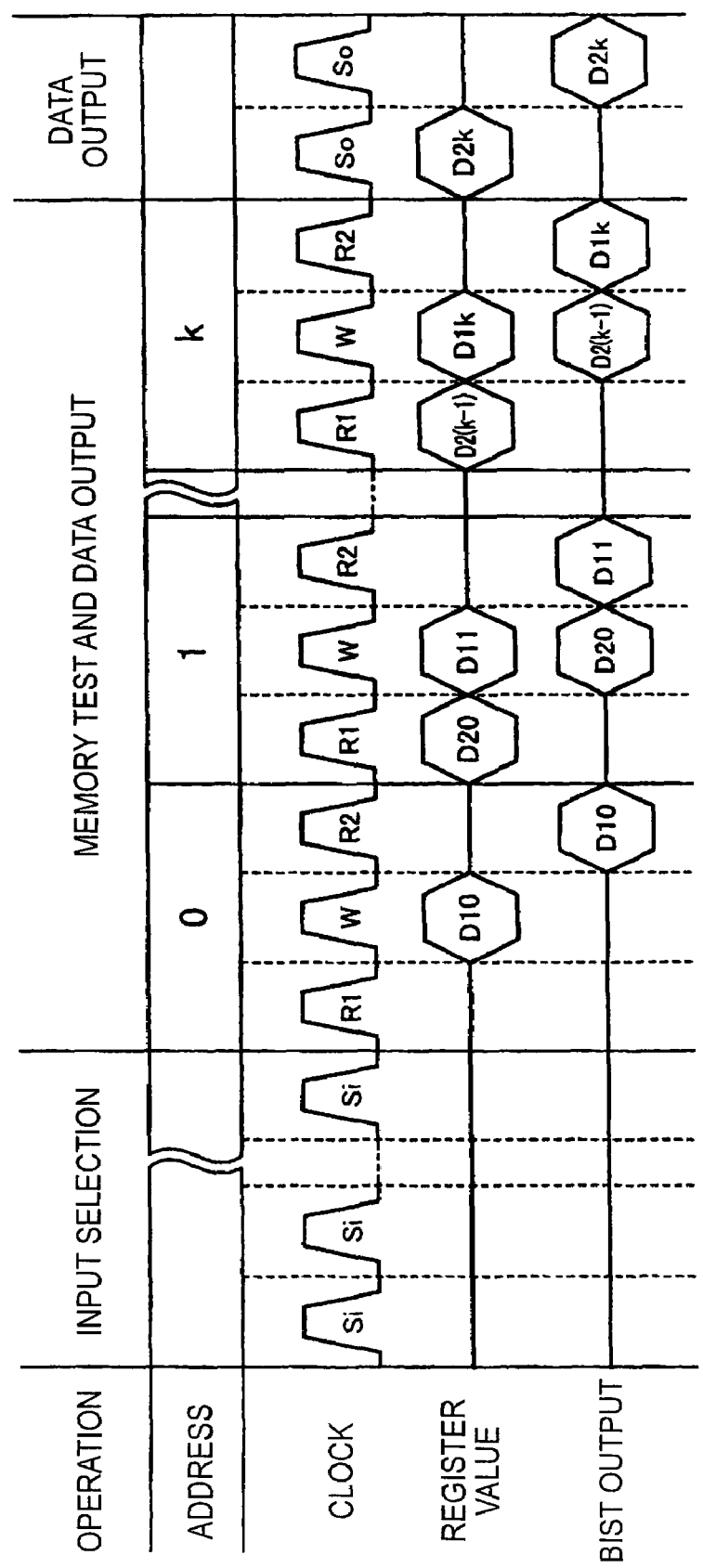
FIG. 7 is an exemplary diagram showing an example of a timing chart of the failure analysis for the semiconductor apparatus according to the embodiment of the invention.

More specifically, as shown in FIG. 7, the pattern data on the selecting signal are successively shifted in (Si) from the input pin 22 to the FFs 60a to 60n of the memory selector 12, and furthermore, the FFs 70a to 70m of each of the I/O selectors 38a to 38n via the shift chain path 26 in an input selecting operation. When a selecting signal is set to the memory setting circuit 66 of the memory selector 12 and each of the I/O setting circuits 76a to 76n of the I/O selectors 38a to 38n so that the target memory and the target I/O circuit are selected, the pattern data on the test signal are input from the input pin 21 to the BIST circuit 10. The BIST circuit 10 successively executes a memory test for the memory cells 132 in addresses 0, 1, ..., k to which access is given from the I/O circuits 80a to 80m of each of the memory cell arrays 33a to 33n based on the pattern data on the test signal.

Figure 8:
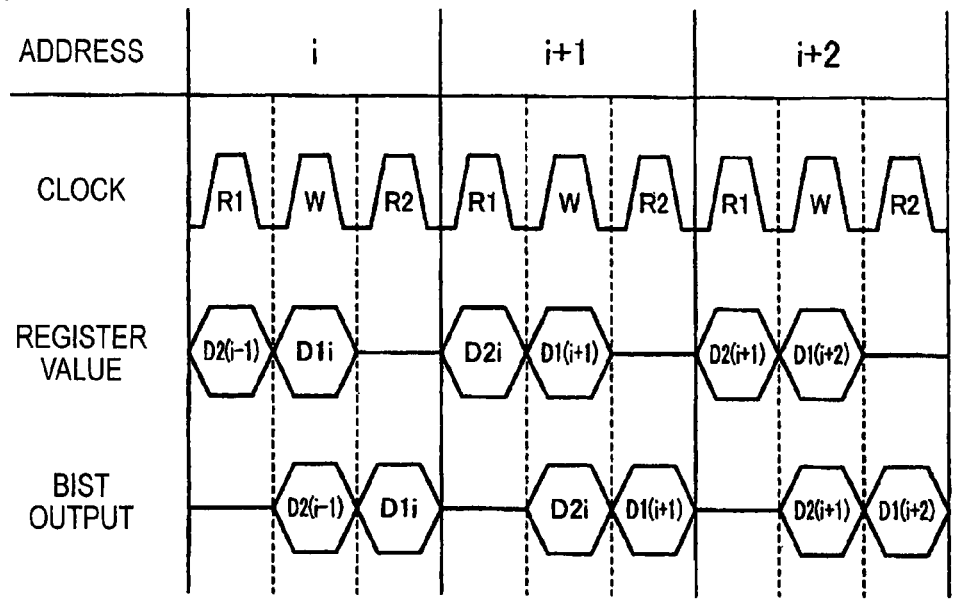
FIG. 8 is an exemplary diagram showing an example of a timing chart of a memory test in the failure analysis for the semiconductor apparatus according to the embodiment of the invention.

In the same manner as in the quality test mode, the memory test is repeated for the addresses 0 to k of the memory cells 132 to which access can be given from each of the I/o circuits of the memories 32a to 32n by setting three steps having the steps R1, W and R2 as one test cycle. For example, as shown in FIG. 8, test data values read in the memory cell 132 in each of the addresses are stored as register values D2 (i−1), D1i, D2i, D1 (i+1), D2 (i+1), and D1 (i+2) in the data registers 34a to 34n synchronously with the steps R1 and R2 so as to be delayed by one clock cycle through the I/O circuits 80a to 80m during the memory test operation for the memory cells 132 in the addresses i to (i+2). The respective register values of the data registers 34a to 34n corresponding to the I/O circuits 80a to 80m are input values of the input nodes (1) to (m) of the I/O selectors 38a to 38n.

For simplicity, description will be given with reference to the I/O selector 38 shown in FIG. 5 on the assumption that the I/O selector 38a is set to be a target I/O selector and the I/O circuit 80a is set to be a target I/O circuit. The I/O selector 38a sets the respective outputs of the I/O circuits 80a to 80m of the target memory to be the inputs of the input nodes (1) to (m). A state of the FF 70a connected to the AND circuit 72a in which the output of the target I/O circuit is set to be the input is "1" and a state of the other FFs 70b to 70m is "0". In the AND circuit 72a, accordingly, an input value of the input node (1) is exactly output. On the other hand, in the AND circuits 72b to 72m, "0" is output. In the OR circuit 74 for inputting the outputs of the AND circuits 72a to 72m, an input value of the AND circuit 72a, that is, a data value of the memory cell 132 read from the target I/O circuit is output.

The memory selector 12 sets the respective outputs of the I/O selectors 38a to 38n to be input values of the input nodes (1) to (n). For example, in FIG. 6, the I/O selector 38a is set to be a target I/O selector. A state of the FF 60a connected to the AND circuit 62a for inputting the output of the I/O selector 38a in the FFs 60a to 60n shown in FIG. 4 is "1" and a state of the other FFs 60b to 60n is "0". In the AND circuit 62a, accordingly, the input value of the input node (1) is exactly output. On the other hand, in the AND circuits 62b to 62n, "0" is output. In the OR circuit 64 for inputting the outputs of the AND circuits 62a to 62n, an input value of the AND circuit 62a, that is, a data value of the memory cell 132 read from the target I/O circuit is output to the FF 16 shown in FIG. 1.

For example, as shown in FIG. 8, the test data values D2 (i−1), D1i, D2i, D1 (i+1), D2 (i+1) and D1 (i+2) which are stored in the data registers 34a to 34n are output as the BIST outputs from the output pin 24 to the comparator 50 of the tester 40 during the memory test operation for the memory cell 132 in each of the addresses i to (i+2).

As shown in FIG. 7, a data output operation is carried out with a delay of two clock cycles during the memory test operation. In order to BIST output data output from the last address k of the target I/O circuit, therefore, a data output operation in two shift-out (So) clock cycles is required.

In a semiconductor apparatus including an existing BIST circuit, a plurality of data registers for once storing a test data signal read from a memory cell is connected like a shift register through a shift chain path. The test data signals stored in the respective data registers are successively output as the BIST outputs from the output pin by the shift-out operation. Accordingly, the memory test is interrupted until all of the data signals stored in the data registers are shifted out. In the failure analyzing mode of the semiconductor apparatus including the existing BIST circuit, thus, it is impossible to carry out the memory test at an actual specification frequency.

In the case in which the test data signals read from the respective memories are directly output to the output pin to carry out the failure analysis, moreover, output pins corresponding to the number of the memories are required. However, the number of external pins of the semiconductor apparatus which are to be assigned for the failure analysis is limited. Therefore, it is not preferable that the output pin should be provided in each of the memories.

In the semiconductor apparatus according to the embodiment of the invention, the I/O selectors 38a to 38n are disposed in the rear stage of the data registers 34a to 34n. Moreover, the memory selector 12 is disposed in the rear stage of the I/O selectors 38a to 38n. The I/O selectors 38a to 38n can successively select and output, every bit, the data signals read from the respective addresses of the memory cells 132 to which access is given from the I/O circuits 80a to 80m of the memories 32a to 32n. Moreover, the memory selector 12 can select one of the memories 32a to 32n. As a result, the test data signal of the target I/O circuit of the target memory which is read in each cycle of the memory test can be output from one output pin 24 to the outside. According to the semiconductor apparatus in accordance with the embodiment, thus, it is possible to output the failure analysis data while testing the memory through the BIST at the actual specification frequency.

In order to read the test data of all of the I/O circuits 80a to 80m in the target memory, the memory test is successively executed for each of the I/O circuits 80a to 80m. In the case in which the memory test is executed for all of the memories 32a to 32n, furthermore, the memory test is executed in such a manner that data of the memory cells 132 are output for all of the memories 32a to 32n with a successive change in the setting of the I/O selectors 38a to 38n and the memory selector 12. Thus, the respective read data signals of the memories 32a to 32n can be output from one output pin 24 to the outside synchronously with the actual specification frequencies of the memories 32a to 32n.

Moreover, the memory selector 12 and each of the I/O selectors 38a to 38n are connected to each other in series like a shift register through the shift chain path 26. By shifting in a selecting signal from one input pin 22, accordingly, it is possible to successively change the setting of the I/O selectors 38a to 38n and the memory selector 12.

Figure 9:
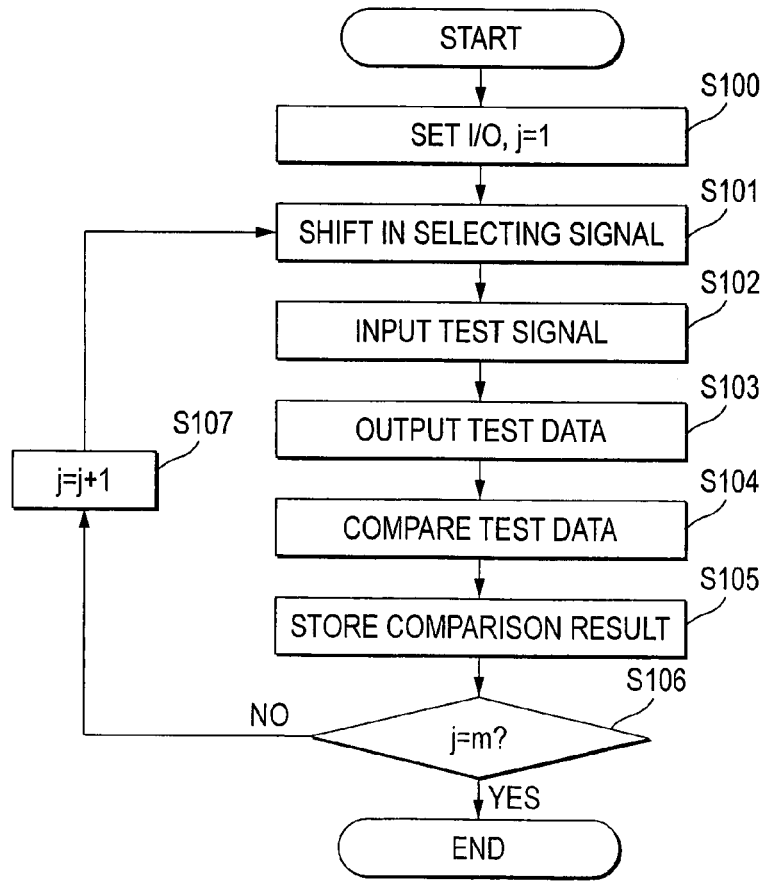
FIG. 9 is an exemplary flowchart showing an example of a method of testing a semiconductor apparatus according to the embodiment of the invention.

Next, the test method according to the embodiment of the invention will be described with reference to a flowchart of FIG. 9. In FIG. 9, description will be given to a method of testing one target memory. In the case in which a plurality of memories to be failure analyzing objects is provided, it is preferable that a processing in FIG. 9 should be executed for each of the target memories.

Referring to a target memory in the memories 32a to 32n shown in FIG. 6, a target I/O circuit, for example, the I/O circuit 80a is set from the I/O circuits 80a to 80m at a step S100. An I/O circuit number j (j is an integer of 1 to m) is set to be one.

At a step S101, pattern data on a selecting signal which are generated by the pattern generator 44 of the tester 40 are shifted in the shift chain path 26 for connecting the memory selector 12 and the I/O selectors 38a to 38n in series through the input pin 22. For example, the memory 32a is selected as a target memory by the memory selector 12, and the I/O circuit 80a is selected as a target I/O circuit by the I/O selectors 38a to 38n.

At a step S102, pattern data on a test signal which are generated by the pattern generator 44 are input to the BIST circuit 10 through the input pin 21 so that a memory test is executed synchronizing with the test signal.

At a step S103, test data signals in the respective addresses of the I/O circuit 80a of the memory 32a are successively output through the output pin 24 from the BIST circuit 10 via the I/O selector 38a and the memory selector 12.

At a step S104, the test data signal is compared with an expected value created in the pattern generator 44 by the comparator 50.

At a step S105, a result of the comparison of the comparator 50 is stored in the failure analyzing memory 48.

At a step S106, an FBM of a memory to be a failure analyzing target is created based on the result of the comparison which is stored in the failure analyzing memory 48 and the pattern data which are stored in the pattern data memory 54 through the main processor 52. The FBM thus created is stored in the FBM memory 56.

At a step S107, an I/O circuit number j is incremented. The processings of the steps S101 to S106 are repetitively executed until the I/O circuit number j reaches m.

In the testing method according to the embodiment of the invention, in the target I/O circuit to be the target memory, it is possible to successively output the read test data signal while executing the memory test at the actual specification frequency for each of the addresses. Moreover, the respective test data signals of the addresses are output from the BIST circuit 10 through one output pin. Furthermore, it is possible to decide an address of a defective bit by using the result of the comparison and the pattern data which are stored in the failure analyzing memory 48 on the test input signal which are stored in the pattern data memory 54.

According to the testing method in accordance with the embodiment of the invention, it is possible to output the failure analysis data while testing the memory at the actual specification frequency through the BIST.

In the embodiment and the testing method according to the embodiment, it is described that a plurality of memories are subjected to the failure analyzing performed by the BIST circuit, but the number of memory may be one. Also, each of the target memories can be activated individually to be subjected to the failure analyzing. In this case, the memory selector may be omitted from the BIST circuit.

(First Variant)

Figure 10:
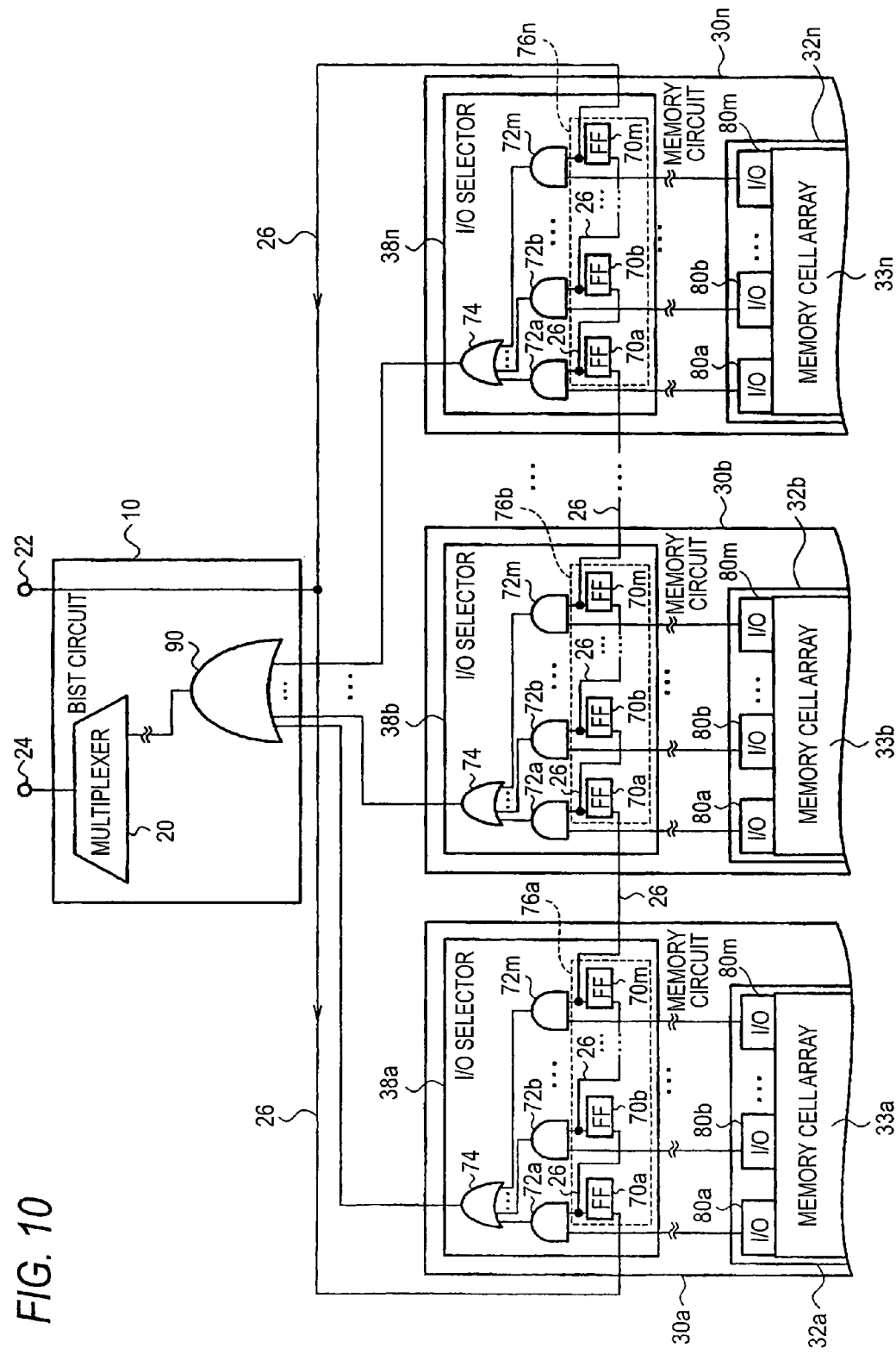
FIG. 10 is an exemplary schematic diagram showing an example of a structure of a semiconductor apparatus according to a first variant of the embodiment of the invention.

A semiconductor apparatus according to a first variant of the embodiment in accordance with the invention comprises a BIST circuit 10 having an OR circuit 90 as shown in FIG. 10. Output nodes of I/O selectors 38a to 38n are connected to an input node of the OR circuit 90 in parallel. An output node of the OR circuit 90 is connected to an input node of a multiplexer 20. I/O setting circuits 76a to 76n of the I/O selectors 38a to 38n are connected to each other in series through a shift chain path 26 connected to an input pin 22.

The first variant according to the embodiment of the invention is different from the embodiment in that there is used the OR circuit 90 for setting the outputs of the I/O selectors 38a to 38n to be inputs and successively selecting and outputting data signals read from respective addresses of a plurality of memory cells every bit. Since the other structures are the same as those in the embodiment, repetitive description will be omitted.

Based on pattern data on a selecting signal to be input from the input pin 22 to each of the I/O setting circuits 76a to 76n through the shift chain path 26, a target memory and a target I/O circuit are selected from memories 32a to 32n and I/O circuits 80a to 80m of each of the memories 32a to 32n. For example, in the case in which the memory 32a and the I/O circuit 80a are selected as the target memory and the target I/O circuit, only an FF 70a of the I/O setting circuit 76a is set to be "1" and respective FFs corresponding to the I/O circuits 80b to 80m of the memory 32a and the I/O circuits 80a to 80m of the memories 32b to 32m which are not selected are set to be "0", respectively. Accordingly, the pattern data on the selecting signal in this case are "10 . . . 000 . . . 0 . . . 00 . . . 0".

A selecting signal generated in the pattern generator 44 shown in FIG. 3 is successively shifted in the FFs 70a to 70m of the I/O setting circuits 76a to 76n of the I/O selectors 38a to 38n from the input pin 22 via the shift chain path 26. When the selecting signal is set to each of the I/O setting circuits 76a to 76n to select the target memory and the target I/O circuit, pattern data on a test signal are input to the BIST circuit 10. Based on the pattern data on the test signal, the BIST circuit 10 successively executes a memory test in addresses of a plurality of memory cells to which access is given from the I/O circuits 80a to 80m of each of the memories 32a to 32n.

In the I/O selectors 38a to 38n, a test data signal of a memory cell in the target I/O circuit of the target memory is selectively output. Accordingly, a data signal read from each of the addresses of the memory cells to which access is given from the target I/O circuit of the target memory can be successively selected and output every bit from the OR circuit 90. According to the semiconductor apparatus in accordance with the first variant of the embodiment, thus, it is possible to output failure analysis data while testing the memory at an actual specification frequency through a BIST.

In the first variant according to the embodiment, moreover, there is used the OR circuit 90 for successively selecting and outputting, every bit, the data signals read from the respective addresses of the memory cells by setting the outputs of the I/O selectors 38a to 38n as the inputs. Accordingly, it is possible to simplify a circuit structure more greatly than that in the memory selector 12 shown in FIG. 4.

In the first variant according to the embodiment, each of the I/O setting circuits 76a to 76n are provided in each of the memory circuit 30a to 30n respectively. However, the positions where the I/O setting circuit to be provided are not limited in the memory circuits. For example, a single I/O setting circuit may be provided in the BIST circuit to be shared by the I/O selectors 38a to 38n.

(Second Variant)

Figure 11:
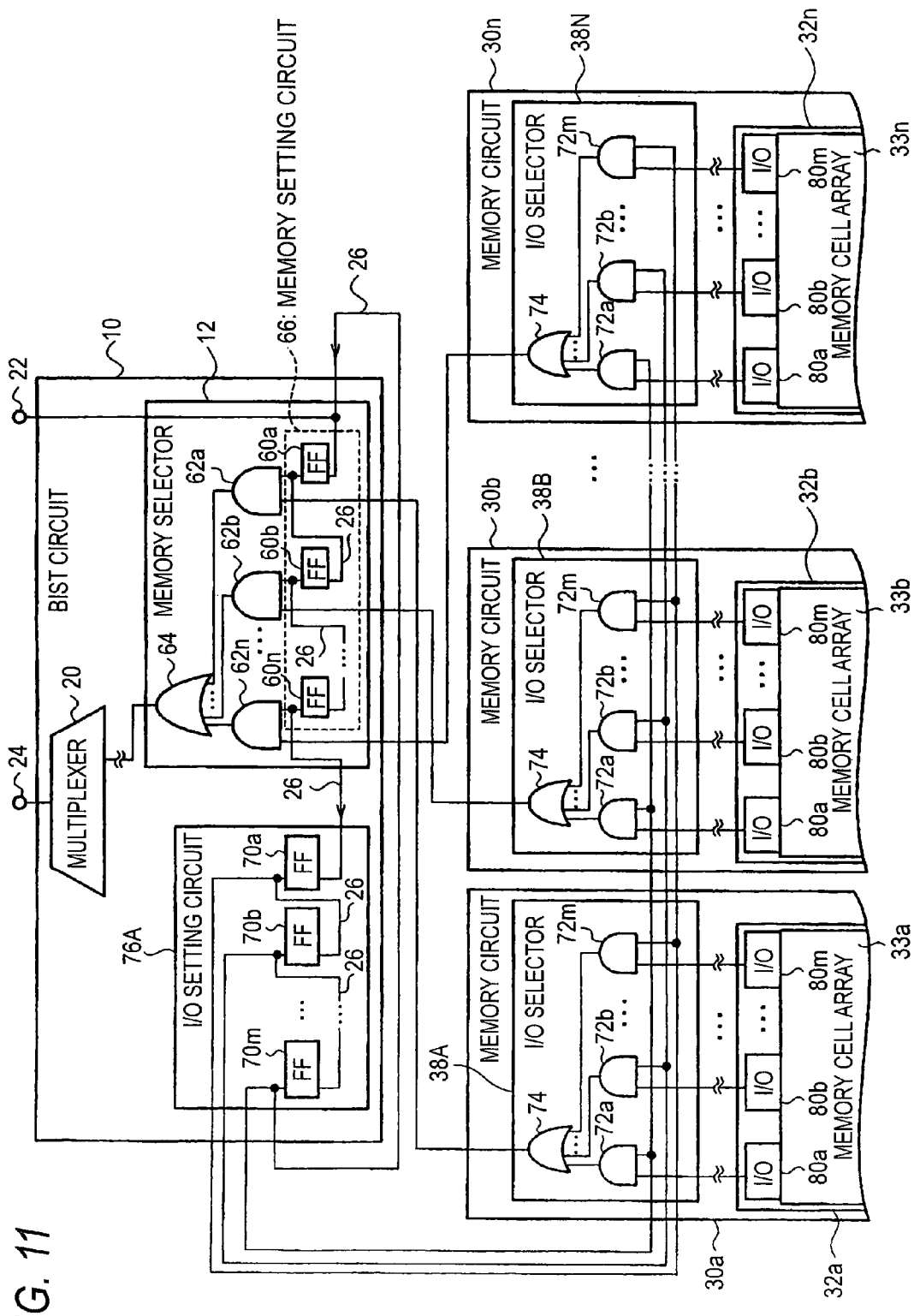
FIG. 11 is an exemplary schematic diagram showing an example of a structure of a semiconductor apparatus according to a second variant of the embodiment of the invention.

As shown in FIG. 11, a semiconductor apparatus according to a second variant of the embodiment of the invention comprises memory circuits 30a to 30n having I/O selectors 38A, 38B, . . . , 38N, and a BIST circuit 10 having a memory selector 12 and an I/O setting circuit 76A. Each of the I/O selectors 38A to 38N includes AND circuits 72a to 72m and an OR circuit 74. The I/O setting circuit 76A has FFs 70a, 70b, . . . , 70m.

FFs 60a to 60n of a memory setting circuit 66 of the memory selector 12 and the FFs 70a to 70m of the I/O setting circuit 76A are connected in series like a shift register through a shift chain path 26, respectively. The FFs 70a to 70m of the I/O setting circuit 76A are connected to the AND circuits 72a to 72m of each of the I/O selectors 38A to 38N in parallel, respectively.

The second variant according to the embodiment of the invention is different from the embodiment in that the I/O setting circuit 76A for setting a selection of a target I/O circuit from I/O circuits 80a to 80m of memories 32a to 32n is shared by the I/O selectors 38A to 38N. Since the other structures are the same as those in the embodiment, repetitive description will be omitted.

Based on pattern data on a selecting signal to be input from an input pin 22 to each of the memory setting circuit 66 and the I/O setting circuit 76A, a target memory and a target I/O circuit are selected from the memories 32a to 32n and the I/O circuits 80a to 80m of each of the memories 32a to 32n. For example, in the case in which the memory 32a and the I/O circuit 80a are selected as the target memory and the target I/O circuit, the FF 60a of the I/O setting circuit 66 and the FF 70a of the I/O setting circuit 76A are set to be "1" and the respective FFs corresponding to the memories 32b to 32n and the I/O circuits 80b to 80m which are not selected are set to be "0", respectively. Accordingly, the pattern data on the selecting signal in this case are "10 . . . 010 . . . 0".

A selecting signal generated in a pattern generator 44 shown in FIG. 3 is successively shifted in the FFs 60a to 60n and 70a to 70m of the memory setting circuit 66 and the I/O setting circuit 76A from the input pin 22 via the shift chain path 26. When the selecting signal is set to each of the memory setting circuit 66 and the I/O setting circuit 76A to select the target memory and the target I/O circuit, pattern data on a test signal are input to the BIST circuit 10. Based on the pattern data on the test signal, the BIST circuit 10 successively executes a memory test for memory cells of addresses to which access is given from the I/O circuits 80a to 80m of each of the memories 32a to 32n.

In the I/O selectors 38A to 38N, a test data signal of a memory cell in the target I/O circuit of each of the memories 32a to 32n is selected and successively output based on setting of the I/O setting circuit 76A. In the memory selector 12, a test data signal of the target memory is selected and successively output from the test data signals of the memory cells of the target I/O circuit in the respective memories 32a to 32n which are input. Accordingly, a data signal read from each of the addresses of the memory cells to which access is given from the target I/O circuit of the target memory can be successively selected and output every bit from the memory selector 12. According to the semiconductor apparatus in accordance with the second variant of the embodiment, thus, it is possible to output failure analysis data while testing the memory at an actual specification frequency through a BIST.

In the second variant according to the embodiment, moreover, the selection of the target I/O circuit of each of the I/O selectors 38A to 38N is set by the shared I/O setting circuit 76A. Therefore, it is possible to simplify the circuit structures of the I/O selectors 38A to 38N.

While the I/O setting circuit 76A is disposed in the BIST circuit 10 in the second variant according to the embodiment, the arrangement is not restricted. For example, it is also possible to dispose the I/O setting circuit in any of the memory circuits 30a to 30n. Alternatively, it is also possible to dispose the I/O setting circuit in a semiconductor apparatus region other than the BIST circuit 10 and the memory circuits 30a to 30n.

Other Embodiments

Although the embodiment according to the invention has been described above, it is to be understood that the statements and drawings constituting a part of the disclosure do not restrict the invention. From the disclosure, various alternative embodiments, examples and application techniques will be apparent to the skilled in the art.

In the embodiment according to the invention, the pattern data on the test signal and the selecting signal are generated by using the timing generator 42, the pattern generator 44 and the pattern data memory 54 in the tester 40. However, it is also possible to generate the pattern data on the test signal and the selecting signal by using the timing generator, the pattern generator and the pattern data memory which are provided in the BIST circuit 10. In this case, pattern data information about the test signal and the selecting signal are prestored in the pattern data memory of the BIST circuit 10.

Thus, it is a matter of course that the invention includes various embodiments which have not been described above. Accordingly, the technical range of the invention is defined by only the specific matters of the invention related to proper claims from the description.

What is claimed is:

1. A semiconductor apparatus comprising:
    a plurality of memory circuits each including a memory and an input/output selector, the memory having a plurality of memory cells and a plurality of input/output circuits respectively corresponding to the memory cells; and
    an incorporated self-test circuit that executes a quality test for the memory,
    wherein the input/output selector selects one of the input/output circuits and successively outputs data signals to the incorporated self-test circuit, the data signals read by the one of the input/output circuits from the corresponding memory cells.

2. The semiconductor apparatus according to claim 1, wherein the incorporated self-test circuit includes a memory selector having a plurality of input nodes and an external output pin, the input nodes each connected to the input/output selector in respective one of the plurality of memory circuits; and
    wherein the memory selector selectively outputs the data signals to the external output pin, the data signals input from the respective input/output selectors at the input nodes.

3. The semiconductor apparatus according to claim 2, wherein the incorporated self-test circuit includes:
    an input/output setting circuit that memorizes first setting information for selecting one of the input/output circuits in each of the memory circuits; and
    a memory setting circuit that memorizes second setting information for selecting one of the memory circuits,
    wherein the input/output selectors are connected in parallel to the input/output setting circuit; and
    wherein each of the input/output selectors selects one of the input/output circuits in accordance with the first setting information memorized in the input/output setting circuit.

4. The semiconductor apparatus according to claim 3, wherein the input/output setting circuit is connected in series to the memory setting circuit via a shift-chain path.

5. The semiconductor apparatus according to claim 2, wherein each of the input/output selectors in the respective memory circuits includes an input/output setting circuit that memorizes first setting information to select one of the input/output circuits,
    wherein the incorporated self-test circuit includes a memory setting circuit that memorizes second setting information for selecting one of the memory circuits.

6. The semiconductor apparatus according to claim 5, wherein the input/output setting circuits are connected in series to the memory setting circuit via a shift-chain path.

7. The semiconductor apparatus according to claim 1, wherein the input/output selector has an input/output setting circuit that memorizes setting information to select one of the input/output circuits.

8. The semiconductor apparatus according to claim 7, wherein the input/output setting circuit is connected in series to another input/output setting circuit of another memory circuit via a shift-chain path.

9. The semiconductor apparatus according to claim 1, wherein the incorporated self-test circuit includes an input/output setting circuit that memorizes setting information to select one of the input/output circuits, wherein the input/output selectors are connected in parallel to the input/output setting circuit; and wherein each of the input/output selectors selects one of the input/output circuits in accordance with the setting information memorized in the input/output setting circuit.

10. A semiconductor apparatus comprising:

a plurality of memory circuits each including a memory and an input/output selector, the memory having a plurality of memory cells and a plurality of input/output circuits respectively corresponding to the memory cells; and an incorporated self-test circuit that executes a quality test for the memory, wherein the input/output selector selects one of the input/output circuits and successively outputs data signals to the incorporated self-test circuit, the data signals read by the one of the input/output circuits from the corresponding memory cells, wherein the incorporated self-test circuit includes an OR circuit having a plurality of input nodes and an external output pin, the input nodes each connected to the input/output selector in respective one of the plurality of memory circuits; and wherein the OR circuit outputs logical sum of the data signal to the external pin, the data signal being input from the input/output selectors in respective one of the plurality of memory circuits to the input nodes.

11. The semiconductor apparatus according to claim 10, wherein the input/output selector has an input/output setting circuit that memorizes setting information to select one of the input/output circuits.

12. The semiconductor apparatus according to claim 11, wherein the input/output setting circuit is connected in series to another input/output setting circuit of another memory circuit via a shift-chain path.

13. The semiconductor apparatus according to claim 10, wherein the incorporated self-test circuit includes an input/output setting circuit that memorizes setting information to select one of the input/output circuits, wherein the input/output selectors are connected in parallel to the input/output setting circuit; and wherein each of the input/output selectors selects one of the input/output circuits in accordance with the setting information memorized in the input/output setting circuit.

14. A method of testing memories of a plurality of memory circuits in a semiconductor apparatus, wherein each of the plurality of memory circuits includes a memory having a plurality of memory cells and a plurality of input/output circuits each accessible to the corresponding memory cells, and an incorporated self-test circuit that executes a quality test for the memories, the method comprising:

selecting a target input/output circuit from the plurality of input/output circuits;

reading data signals from target memory cells corresponding to the target input/output circuit;

successively writing test signals through the target input/output circuit to the target memory cells;

selecting test data signals read successively from the target memory cells through the target input/output circuit; and outputting the test data signals from the target memory to an external output pin.

* * * * *